United States Patent
Asoodar

(10) Patent No.: US 12,176,822 B2
(45) Date of Patent: Dec. 24, 2024

(54) CONDITION MONITORING OF SEMICONDUCTOR DEVICES IN A CONVERTER

(71) Applicant: ABB Schweiz AG, Baden (CH)

(72) Inventor: Mohsen Asoodar, Västerås (SE)

(73) Assignee: ABB Schweiz AG, Baden (CH)

(*) Notice: Subject to any disclaimer, the term of this patent is extended or adjusted under 35 U.S.C. 154(b) by 246 days.

(21) Appl. No.: 17/755,174

(22) PCT Filed: Oct. 30, 2019

(86) PCT No.: PCT/EP2019/079604
§ 371 (c)(1),
(2) Date: Apr. 22, 2022

(87) PCT Pub. No.: WO2021/083501
PCT Pub. Date: May 6, 2021

(65) Prior Publication Data
US 2022/0393611 A1     Dec. 8, 2022

(51) Int. Cl.
*H02M 7/48*     (2007.01)
*G01R 31/40*   (2020.01)
(Continued)

(52) U.S. Cl.
CPC .......... *H02M 7/4835* (2021.05); *G01R 31/40* (2013.01); *H02M 1/0009* (2021.05); *H02M 1/08* (2013.01);
(Continued)

(58) Field of Classification Search
CPC .... H02M 7/4835; H02M 1/0009; H02M 1/08; H02M 1/32; H02M 7/217; H02M 7/537; G01R 31/40
See application file for complete search history.

(56) References Cited

U.S. PATENT DOCUMENTS

2015/0372612 A1* 12/2015 Nami .................... H02M 7/219
                                                                    363/123

FOREIGN PATENT DOCUMENTS

| CN | 103746575 A | 4/2014 |
| EP | 2549634 A1 | 1/2013 |
| EP | 2595302 A1 | 5/2013 |

OTHER PUBLICATIONS

Patil, Nishad, et al.; "Precursor Parameter Identification for Insulated Gate Bipolar Transistor (IGBT) Prognostics"; Jun. 2009 IEEE Transactions on Reliability, vol. 58, No. 2; IEEE; Piscataway, NJ, US; May 26, 2009; 6 Pages.

(Continued)

*Primary Examiner* — Rafael O De Leon Domenech
(74) *Attorney, Agent, or Firm* — Whitmyer IP Group LLC

(57) ABSTRACT

A method of monitoring condition of a modular multilevel converter, wherein the modular multilevel converter includes submodules having a capacitor and controllable switches. The method including selecting a submodule, controlling the controllable switches of the selected submodule to form a current path through the submodule by controlling at least one controllable switch to a conducting state and at least one controllable switch to a blocking state, disconnecting the voltage of the capacitor of the selected submodule from the submodule, performing measurements on at least one controllable switch that was controlled to a blocking state.

15 Claims, 4 Drawing Sheets

(51) Int. Cl.
  *H02M 1/00*     (2006.01)
  *H02M 1/08*     (2006.01)
  *H02M 1/32*     (2007.01)
  *H02M 7/217*    (2006.01)
  *H02M 7/483*    (2007.01)
  *H02M 7/537*    (2006.01)

(52) U.S. Cl.
  CPC ............. *H02M 1/32* (2013.01); *H02M 7/217* (2013.01); *H02M 7/537* (2013.01)

(56) References Cited

OTHER PUBLICATIONS

Masoud, Farhadi, et al.; "DC-AC Converter-Fed Induction Motor Drive with Fault-Tolerant Capability under Open- and Short-Circuit Switch Failures"; Feb. 2018 IEEE Transactions on Power Electronics, vol. 33, No. 2; IEEE; Mar. 16, 2017; 27 Pages.

International Search Report and Written Opinion of the International Searching Authority; Application No. PCT/EP2019/079604; Completed: Jun. 19, 2020; Mailing Date: Jun. 29, 2020; 11 Pages.

\* cited by examiner

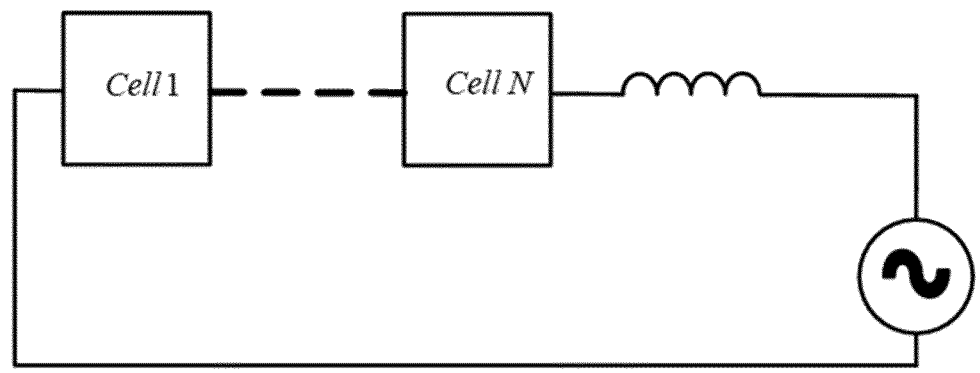
FIG. 1
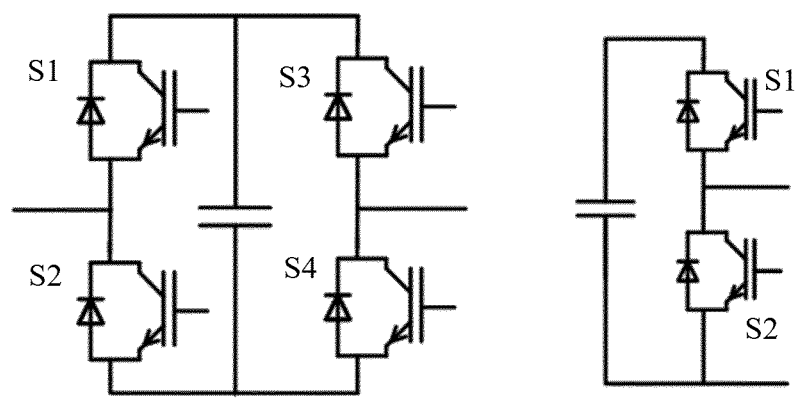 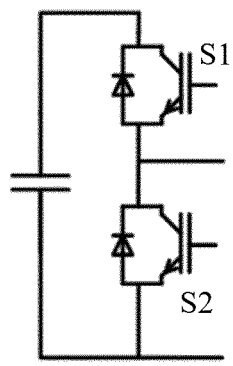
FIG. 2A              FIG. 2B

CONDITION MONITORING OF SEMICONDUCTOR DEVICES IN A CONVERTER

TECHNICAL FIELD

The invention relates to monitoring condition of semiconductor devices, and particularly to monitoring the condition of semiconductor switches in a converter and specifically in a modular multilevel converter.

BACKGROUND

Multilevel converters are used in a wide variety of converter applications. When higher voltage levels are used, the voltage and/or current ratings of typical semiconductor devices are exceeded, and parallel or series connections of semiconductor devices are needed to handle voltages or currents. The parallel or series operation of semiconductor switches is not, however, straightforward as the switch devices need to be matched such that currents and voltages are divided evenly. In a multilevel converter voltage is divided inside the converter such that each semiconductor switch device operates on smaller voltage. These smaller voltage steps are used for building a higher voltage by connecting required amount of smaller voltages in series.

Typical applications of multilevel converters include, for example, solar inverters, flexible AC transmission systems (FACTS), STATCOMs and high-voltage DC (HVDC) power transmission. Multilevel converters can also be operated in rectifying or in inverting mode. For example, in HVDC transmission applications multilevel converters are commonly used in both ends of the DC transmission line for rectifying AC voltage to a DC voltage and for inverting DC to an AC voltage.

One type of multilevel converter is a modular multilevel converter (MMC) in which a required amount of active converting cells are stacked. Each cell or submodule contains its own storage capacitor together with controllable switches. The voltage of the capacitor can be either by-passed or connected in series with other capacitors for forming output voltage. Each submodule acts as an independent converter generating a voltage having a value of zero volts or non-zero voltage. An MMC converter may comprise hundreds of submodules in a one leg of the converter which builds one phase of converter. When the number of series connected submodules is increased, the voltage rating of the converter can be increased.

The submodules may employ half-bridge or full-bridge topologies. In a half-bridge topology two controllable switch components are used to either connect the voltage of the capacitor to the circuit or to by-pass the capacitor, while in a full-bridge circuit four controllable switch devices are employed. Other topologies also exist for either connecting the voltage of the capacitor to a circuit or to by-pass the capacitor.

MMC converters are critical devices in the sense that a breakdown of the converter may lead to interruption of the operation. In HVDC transmission, for example, the operation of the converter should be as reliable as possible for ensuring the continuous power transmission. In the known devices, the working condition of the submodules cannot be determined during the use of the device. Maintenance of the device may be carried out by calculating approximate working hours and estimating when the submodule should be replaced by a new one. Another alternative is to remove a submodule from the circuit and measure its health offline. Further, limited measurements of the device can be carried out while submodules are connected to the converter.

SUMMARY

An object of the present invention is to provide a method and an apparatus for implementing the method so as to overcome the above problem. The object of the invention is achieved by a method and an apparatus which are characterized by what is stated in the independent claims. The preferred embodiments of the invention are disclosed in the dependent claims.

The invention is based on the idea of disconnecting the voltage of the capacitor of a submodule and performing measurement on the controllable switch components which are controlled to a blocking state. During the measurement the output from the submodule is zero, i.e. the voltage of the capacitor is not connected to the output of the submodule and a current path through the submodule is formed. Measurements carried out may be curve tracing measurements, in which certain current or voltage curves are obtained from which the working condition of the switching devices can be determined.

An advantage of the method and apparatus of the invention is that the condition of the submodules and thus the condition of the converter can be determined during the use of the converter. The method and apparatus of the invention can be implemented with a low number of additional electric circuits. With the method and the apparatus of the invention, the condition monitoring of the apparatus can be automized. Further, the condition monitoring may provide information which enables to predict faults and replace submodules prior to a fault situation.

BRIEF DESCRIPTION OF THE DRAWINGS

In the following the invention will be described in greater detail by means of preferred embodiments with reference to the attached drawings, in which FIG. 1 shows an example of stacked submodules of a modular multilevel converter;

FIGS. 2A and 2B shows examples of submodules;

DETAILED DESCRIPTION

FIG. 1 shows a basic circuit arrangement of one phase of a modular multilevel converter. Two cells or submodules Cell 1 and Cell N are shown in FIG. 1. The number of these submodules is not limited to any certain number, and a high number of submodules may be stacked. Further, each phase of the system is formed of similarly stacked submodules. DC voltage is connectable between the ends of the stacked submodules, and the DC voltage is divided between the capacitors of the submodules in a known manner. The circuit of FIG. 1 is highly simplified showing only stacked submodules which are connected to an alternating voltage through an inductor.

Figure 6:
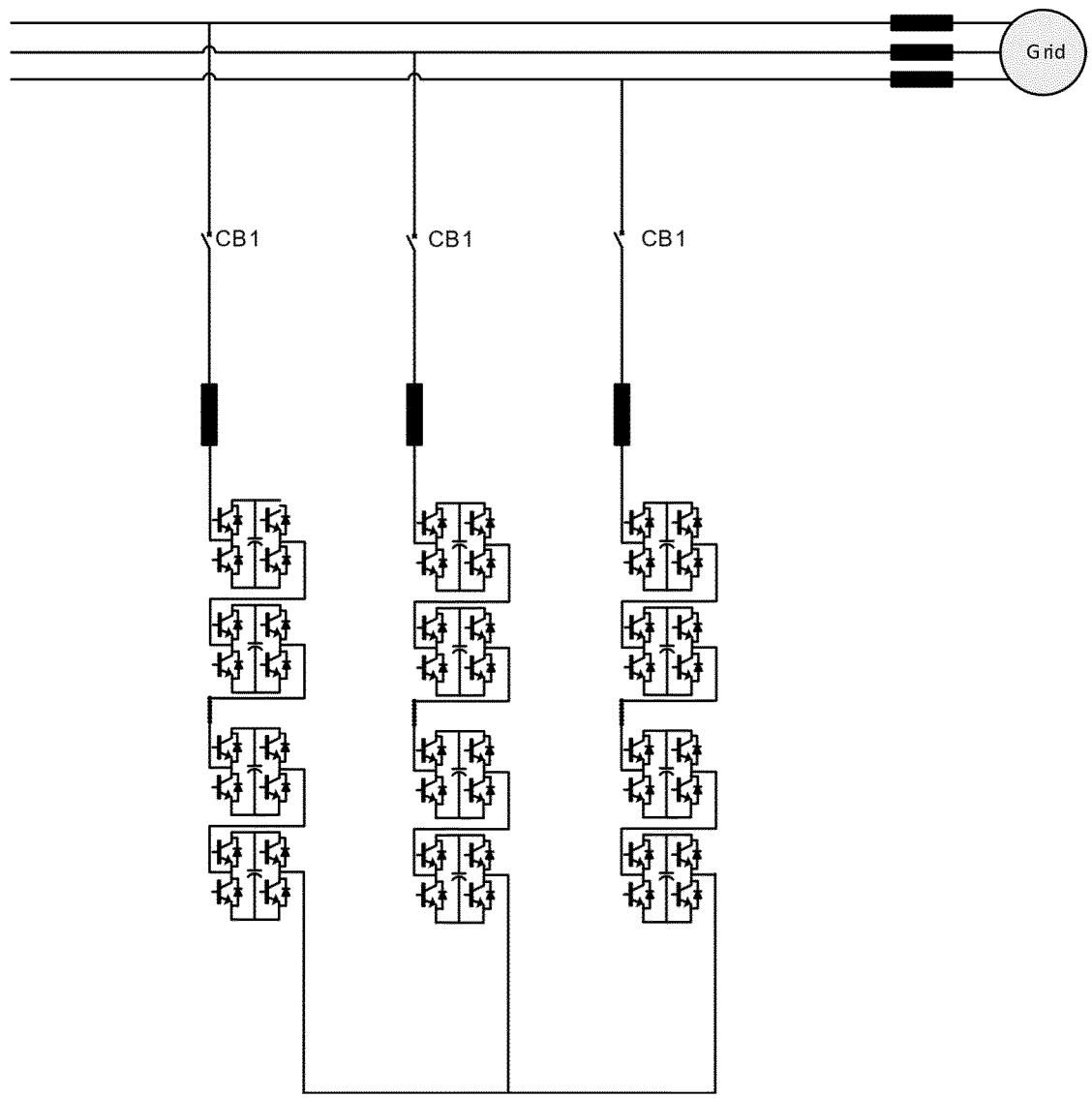
FIG. 6 shows an example of employing stacked submodules in a STATCOM.

FIG. 2A shows an example of a submodule or a cell. The submodule of the example is formed of a full bridge circuit and a capacitor. The full bridge circuit comprises four controllable switches with which the capacitor voltage can be connected to the series connection submodules or the capacitor can be by-passed in a known manner. FIG. 2B shows another example of a submodule which comprises a half-bridge circuit and a capacitor. FIG. 6 shows a STATCOM which is connected to a network for conditioning the power in the network. In the example of FIG. 6, the Y-connected STATCOM comprises four stacked submodules in each phase.

In the method of the invention a submodule is selected from the modular multilevel converter and the controllable switches of the selected submodule are controlled to form a current path through the submodule. The formed current path refers to a path without the capacitor of the submodule. As the capacitor is not connected to the path, the output from the module is zero Volts. Other controllable switches are controlled to a blocking state. Considering a submodule of FIG. 2A, when switches S1 and S3 are controlled conductive and switches S2 and S4 are controlled blocking, a current path is formed through the submodule through switches S1 and S3 and the output voltage of the submodule is zero Volts. Correspondingly, when switches S2 and S4 are controlled conductive and S1 and S3 are blocking, a current path is formed through the submodule and the output voltage of the submodule is zero Volts. In connection with a submodule with half-bridge circuit, such as FIG. 2B, a current path is formed by controlling switch S2 conductive and S1 blocking. With the current path through the component, the output voltage of the submodule is zero Volts, the capacitor is by-passed and thus the voltage of the capacitor is not connected to the output.

In the invention a submodule is selected in order to perform measurement on at least one controllable switch of the selected submodule. The selection of a submodule may be carried out in a timed manner, i.e. a higher level control system may keep track on submodules and on the time instant of the previous measurements. Another possibility is to select the submodules in a certain order. For example, when measurements can be carried out, the selection of the submodules proceeds in a certain order which is tracked by a higher-level controller.

Further in the present invention, the voltage of the capacitor of the selected submodule is disconnected from the submodule. With the disconnection of the voltage of the capacitor it is referred to an action leading to a state in which the capacitor is not electrically connected to the rest of the submodule. When disconnected, the voltage of the capacitor cannot produce a flow of current to the submodule. Further in the invention, measurements are performed on at least one controllable switch which was not carrying current when the voltage of the capacitor was disconnected from the submodule.

When input voltage to the system allows to take one submodule out of use, the measurements of the invention can be enabled. Further, the converter may be built to have redundant submodules in each phase. In such the number of submodules used in active operation is less than the number of submodules of the system. Such a structure enables to have one or more submodules out of use even when operating at nominal voltages.

When the input voltage to the system allows to take one submodule out of use, the submodule can be selected, and the operation of the system can be continued. The voltage fed to the system is divided between the capacitors of the submodules.

Once it is noticed that the voltage of the system does not require all the submodules in operation or when redundant submodules are otherwise available, a submodule is selected as described above. Further, according to an embodiment of the invention, if the timely duration of the measurements is shorter than a half-cycle of the fundamental voltage of the converter, the measurements can be performed as will be described in more detail below.

Figure 3:
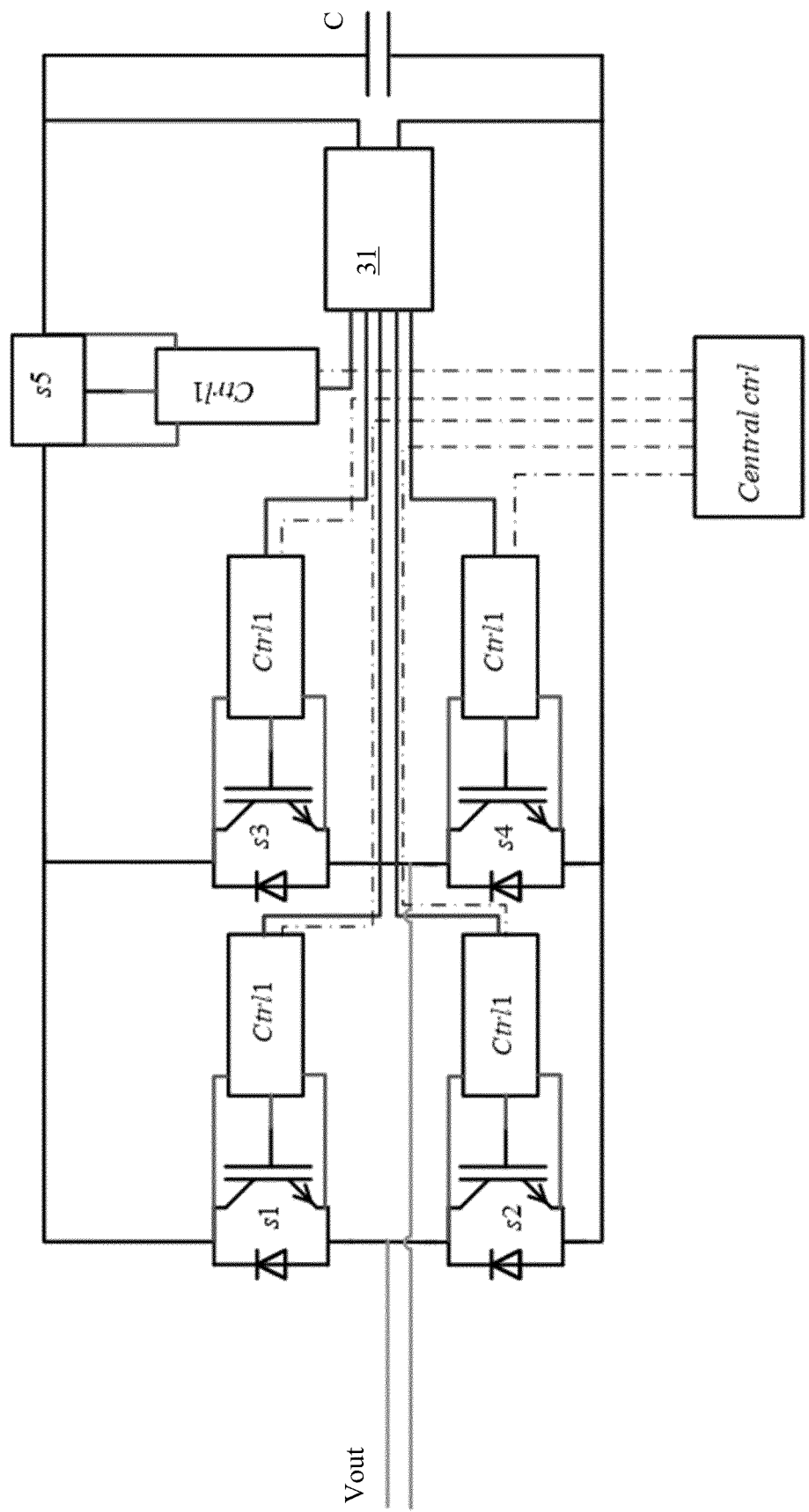
FIG. 3 shows an embodiment of the invention.

The operation of the method and the embodiments thereof are described in the following with reference to FIG. 3 which shows an embodiment of the apparatus of the invention. FIG. 3 shows an embodiment of a submodule with a full-bridge converter. The full-bridge converter is formed with four controllable switch devices, such as IGBTs s1, s2, s3, s4. The output voltage Vout is obtained from the points between switches s1 and s2 and switches s3 and s4. The switches can be used to control the voltage of the capacitor C to the output or to produce a current path through the submodule passing-by the capacitor C, whereby the output voltage is zero Volts.

FIG. 3 shows gate driver circuits Ctrl1 which are connected to the electrodes of each controllable switch components. The gate driver circuits are circuits which are able to provide suitable gate voltages to the controllable switch components in a known manner. The gate drivers obtain control instructions from a central controller Central ctrl or another device which calculates or obtains instructions as when to control the components conductive and blocking. Further, FIG. 3 shows a voltage converter 31 producing auxiliary voltages to the gate drivers.

According to the invention, the submodule comprises a disconnecting switching device s5 which is arranged to disconnect the voltage of the capacitor of the submodule from the full-bridge. As shown in FIG. 3, a gate driver circuit Ctrl1 is connected to control the disconnecting switching device similarly as the switches of the bridge circuit. When the disconnecting switching device is controlled to a blocking state the voltage of the capacitor C cannot affect the bridge circuit, i.e. current cannot flow from the capacitor or to the capacitor. The disconnecting switching device s5 is thus in the submodule to disconnect the capacitor. The switching device s5 can be of the same type as the switching devices of the bridge circuit. However, the type of the disconnecting switching device may also be any other controllable switch device. The disconnecting switching device obtains also control from the Central ctrl device.

The measurement of the invention can be carried out when redundant submodules are installed, the required voltage is so low that all the submodules are not required, or the measurement can be carried out in time period which is less than a half-cycle of the main frequency of the voltage. In case of the first two of the above, any one of the submodules of the converter may be controlled to an idle state. That is, when, for example, one redundant submodule is installed, one submodule is constantly in a state in which current flows through the submodule and the output from the module is zero Volts. The module which is in idle state can be freely selected. Similarly, when the required voltage is low, a freely selectable submodule is in an idle state. When, on the other hand, all the submodules are used, the measurement should be carried out during the time period in which actively used submodule is conducting, i.e. when the output from the module is zero Volts.

When in the method, the submodule is selected, a current path is formed through the submodule using switches s1 and s3 or s2 and s4. Once the current path is formed, the output voltage is zero, and the capacitor can be disconnected using switch s5. It should be noted, the when the measurement is carried out on an active submodule, the current path is formed due to the modulation of the converter, and the time period of the current path is used in the invention to carry out the measurements.

Once the switch s5 has been opened to disconnect the capacitor, the measurements can be carried out on the controllable switching devices which were in the blocking state when the capacitor was disconnected. That is, if the current path is formed using switches s1 and s3, the switches s2 and s4 may be measured one at a time. During the measurements, the switches s2 and s4 are controlled ON and OFF as required by the measurements.

The performed measurements are preferably curve tracing measurements. The gate driver units Ctrl1 are preferably constructed to carry out the required measurements. For that reason, the gate driver units are shown to be connected to each terminal of the controlled switches. The typical curve tracing measurements include collector-emitter voltage vs collector current (VCE vs IC), gate-emitter voltage vs collector current (VGE vs IC), gate-emitter capacitance vs collector-emitter voltage (CGE vs VCE), collector-emitter capacitance vs collector-emitter voltage (CCE vs VCE), collector-gate capacitance vs collector-emitter voltage (CGC ye VCE) and the device temperature. The curve tracing measurements are known as such. In curve tracing, different operation related curves can be determined. In curve tracing different current or voltage sweeps are generated to the semiconductor switch terminals. For the curve tracing the gate driver units are connected to each terminal of the controllable semiconductor switch, that is, to collector, gate and emitter. The gate driver may be able to produce variable voltages and/or currents to each of the terminals. For example, the collector-emitter voltage may be changed during the curve tracing. Further, the gate driver may include circuitry for measuring currents and/or voltages in each terminal of the controlled switch component. Although the curve tracing method is known as such, a few measurements are briefly discussed in the following.

Typical curve tracing measurements to which switch components can be subjected to include gate-emitter (VGE) voltage versus collector current, collector-emitter (VCE) voltage versus collector current (IC) and measurement of input and output capacitances of a switch component. These tests are known as such when semiconductor components are measured off-line and are briefly discussed in the following.

Figure 4:
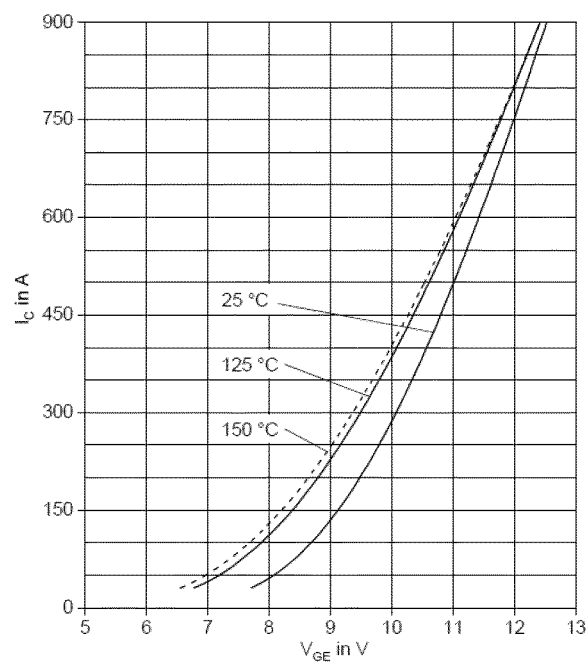
FIGS. 4 and 5 show examples of voltage-current characteristics obtained with curve tracing.

In gate-emitter voltage versus collector current (or gate-source voltage versus drain current) test the gate to emitter voltage is gradually increased similarly as in a very slow turn-on transition while the DC voltage is fixed. FIG. 4 shows an example of such measurement results. The operation of the test should be slow enough for the measurement units to acquire multiple of data points during the transition. The operation can be repeated for different values of collector-emitter (or drain—source) voltage which can be changed using the gate driver unit.

Figure 5:
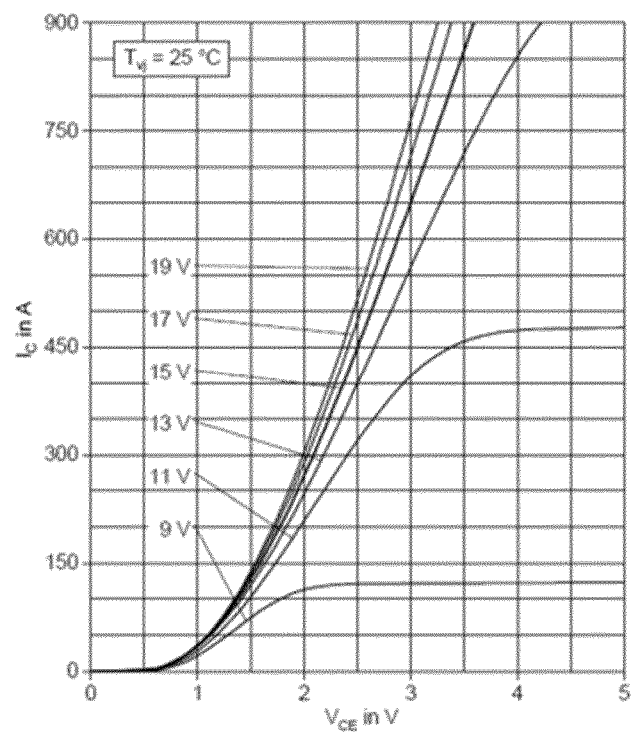

FIG. 5 shows another example of characteristic curves obtainable with the measurements. FIG. 5 shows a measurement of collector-emitter voltage versus collector current. The measurement is carried out by switching the component on and off with a higher frequency and lower DC voltage than in the normal operation. In FIG. 5, the DC voltage is ranging from 0 V to 5 V while varying the gate voltage from 9 Volts to 19 Volts.

At different collector-emitter voltages, a slow turn-on transition can allow for extracting the amount of charge passing through the gate and through the collector-emitter with an acceptable sampling rate. As the largest variations in the input and output capacitances of the switch component are at low collector-emitter voltages, this study should be performed at reduced DC voltage. Alternatively, these capacitances can be identified via injecting a high frequency signal to the collector-emitter and gate of the device at different collector-emitter voltages and measuring the corresponding currents.

This procedure can be repeated, one switching device at a time, and one submodule at a time until all submodules are covered. This procedure can then be repeated after certain time intervals, and used for identifying variations in semiconductor device parameters. These variations can then be used to identify the health state of the device.

Similarly, as the controllable semiconductor switches s1 . . . s4, the disconnecting switch component s5 can be curve traced when a current path is formed through the switches s1 and s3 or s2 and s4, i.e. when the voltage of the capacitor is not connected to the output.

The above measurements are able to provide data according to which the health of the controllable switch components can be determined. The data may comprise multiple of data points, interpolated values of various curves or estimated values. Multiple of data points can be gathered for example from measurements which produce a curve. These multiple data points may be used to form a curve having parameters, and these curve parameters may be used in estimating the health of the device. Further, different values can be obtained directly from the measurements and these values may be used as indicating the health. These values may, for example, include maximum or minimum values, maximum or minimum values with different measurement properties. The above measurements are examples of possible measurements which may be used for indicating the health of the controllable switch.

The results obtained from the measurement are preferably stored in a memory together with a time stamp and an identification of the measured switch component and submodule. When measurements are repeated, the changes in the obtained results indicate more clearly the health or operation condition of the switching component in question. If, for example, change in a certain measurement result is detected, the properties of the component have been changed. This change may indicate that the component will soon fail.

The measurement results, measured values or indicative data may be stored in a database which may comprise respective data on healthy device. The data on healthy device can be used to determine if the obtained data indicates as such that the device is nearing its end. This database may be located remotely of the converter and the data may be transmitted to the database using a communications network.

According to an embodiment of the invention, the measurements are carried out when the temperature of the submodule or the selected switch component has reached a certain level or after a time period the selected switch component has been idle. The submodules of the converter are typically cooled with a circulating liquid. When a semiconductor switch component has been idle for a certain period of time, the cooling has brought the temperature of the switch component to a certain level. When the temperature of the device is brought to a certain level, the temperature variations do not have an effect on the obtained results. Thus, in the embodiment, before the curve tracing is started, a certain idle period is started for allowing the temperature of the switch device to sink to a steady-state level. When all measurements are carried out in reduced, known and roughly at the same temperatures, the effect of temperature variations is eliminated from the measurements. Accordingly, in one embodiment one of the measurements carried out during the condition monitoring is temperature measurement.

In the embodiments shown in the drawings the submodules are formed of a full-bridge circuit. However, the topology of the submodules is not restricted to that shown and described.

It will be obvious to a person skilled in the art that, as the technology advances, the inventive concept can be implemented in various ways. The invention and its embodiments are not limited to the examples described above but may vary within the scope of the claims.

The invention claimed is:

1. A method of monitoring condition of a modular multilevel converter, wherein the modular multilevel converter comprises submodules having a capacitor and controllable switches, the method comprising:
   selecting a submodule;
   controlling the controllable switches of the selected submodule to form a current path through the submodule by controlling at least one controllable switch to a conducting state and at least one controllable switch to a blocking state;
   disconnecting a voltage of the capacitor of the selected submodule from the submodule; and
   performing measurements on the at least one controllable switch that was controlled to the blocking state.

2. The method of claim 1, wherein the disconnecting the voltage of the capacitor from the submodule comprises blocking the current path from the capacitor.

3. The method of claim 2, wherein the blocking the current path from the capacitor comprises controlling a controllable switch to a blocking state.

4. The method of claim 1, wherein the measurements are curve tracing measurements.

5. The method of claim 1, wherein the measurements comprise temperature measurements.

6. The method of claim 1, wherein results of the measurements are stored and compared to results of previous measurements.

7. The method of claim 6, wherein the results of the measurements comprise voltage or current curves, voltage or current slopes, values of current or voltage or values of capacitances.

8. The method of claim 1, wherein the method comprises: keeping the selected submodule idle for a time period for lowering a temperature of the controllable switches.

9. The method of claim 1, wherein during the method the converter is in active use either as a rectifier or as an inverter.

10. A modular multilevel converter, the modular multilevel converter comprising:
    submodules having a capacitor and controllable switches;
    means adapted to select a submodule;
    means adapted to control the controllable switches of the selected submodule to form a current path through the submodule by controlling at least one controllable switch to a conducting state and at least one controllable switch to a blocking state;
    means adapted to disconnect a voltage of the capacitor of the selected submodule from the submodule; and
    means adapted to perform measurements on the at least one controllable switch that was controlled to the blocking state.

11. The modular multilevel converter of claim 10, wherein the means adapted to control the controllable switches comprise gate driver circuits.

12. The modular multilevel converter of claim 11, wherein each submodule comprises a voltage converter for providing an auxiliary voltage to the gate drive circuits from the voltage of the capacitor.

13. The modular multilevel converter of claim 11, wherein the means adapted to perform measurements comprise:
    means for producing switching instructions to a selected controllable switch, and
    means for measuring currents and voltages during the measurement on the selected controllable switch.

14. The modular multilevel converter of claim 12, wherein the means adapted to perform measurements comprise:
    means for producing switching instructions to a selected controllable switch, and
    means for measuring currents and voltages during the measurement on the selected controllable switch.

15. A modular multilevel converter, comprising:
    submodules, each submodule having a capacitor, controllable switches, and a controllable switching element configured to connect a voltage of the capacitor to the submodule in a first state and to disconnect the voltage of the capacitor from the submodule in a second state; and
    a control arrangement configured to:
    select a submodule;
    control the controllable switches of the selected submodule to form a current path through the submodule by controlling at least one controllable switch to a conducting state and at least one controllable switch to a blocking state;
    control the controllable switching element of the selected submodule to disconnect the voltage of the capacitor of the selected submodule from the submodule; and
    perform measurements on the at least one controllable switch that was controlled to the blocking state.

* * * * *